United States Patent
Shim et al.

(10) Patent No.: US 9,190,120 B2
(45) Date of Patent: Nov. 17, 2015

(54) STORAGE DEVICE INCLUDING RESET CIRCUIT AND METHOD OF RESETTING THEREOF

(75) Inventors: Hojun Shim, Yongin-si (KR); Woo-Sung Cho, Seoul (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 632 days.

(21) Appl. No.: 13/238,055

(22) Filed: Sep. 21, 2011

(65) Prior Publication Data

US 2012/0099392 A1    Apr. 26, 2012

Related U.S. Application Data

(60) Provisional application No. 61/394,983, filed on Oct. 20, 2010.

(51) Int. Cl.
G11C 5/14    (2006.01)

(52) U.S. Cl.
CPC .................................... G11C 5/147 (2013.01)

(58) Field of Classification Search
CPC .......... G11C 5/14; G11C 5/147; G11C 5/143; G11C 5/144; G11C 5/145

USPC .................................. 365/226, 227, 229, 241
See application file for complete search history.

(56) References Cited

U.S. PATENT DOCUMENTS

| | | | |
|---|---|---|---|
| 6,901,012 B2 * | 5/2005 | Ikehashi et al. | 365/189.15 |
| 7,733,712 B1 * | 6/2010 | Walston et al. | 365/189.11 |
| 2006/0274578 A1 | 12/2006 | Kwak et al. | |
| 2007/0274132 A1 * | 11/2007 | Ogiwara et al. | 365/185.23 |
| 2009/0096506 A1 * | 4/2009 | Ogiwara et al. | 327/530 |
| 2010/0332862 A1 * | 12/2010 | Lester et al. | 713/300 |

FOREIGN PATENT DOCUMENTS

| | | |
|---|---|---|
| JP | 2008-262669 | 10/2008 |
| KR | 10-2006-0115129 | 11/2006 |
| KR | 10-2008-0024370 | 3/2008 |

* cited by examiner

Primary Examiner — Tha-O H Bui
(74) Attorney, Agent, or Firm — EIPG, PLLC

(57) ABSTRACT

A data storage device including a reset circuit and a method of resetting thereof includes a memory device to receive a driving voltage through a power terminal thereof, a voltage regulator to adjust an external voltage to provide the adjusted voltage to the power terminal of the memory device, and a reset circuit to discharge an enable terminal of the voltage regulator or the power terminal of the memory device according to a change of the external voltage.

27 Claims, 14 Drawing Sheets

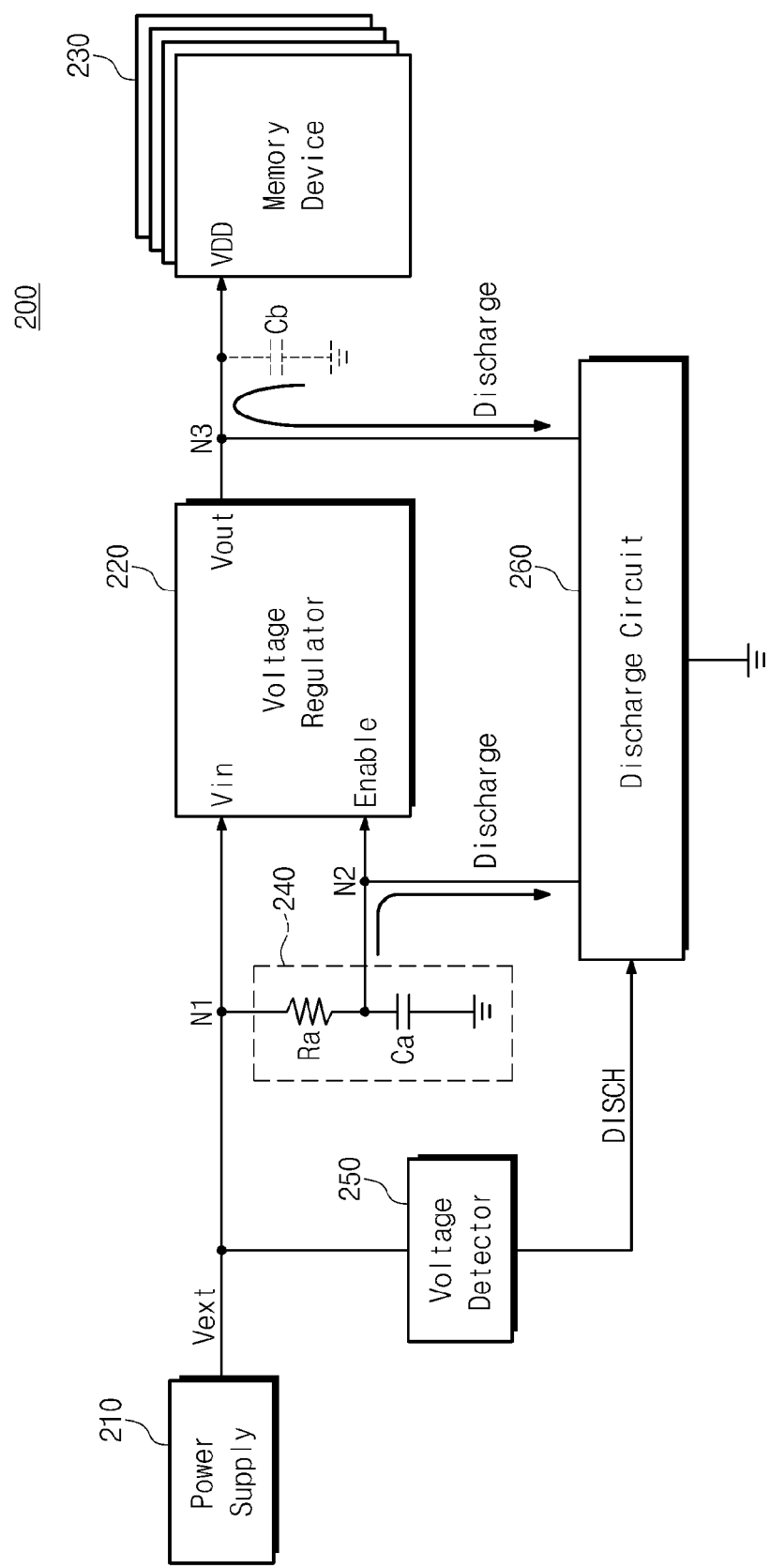

STORAGE DEVICE INCLUDING RESET CIRCUIT AND METHOD OF RESETTING THEREOF

CROSS-REFERENCE TO RELATED APPLICATIONS

This U.S. non-provisional application claims priority under 35 U.S.C. §119 to U.S. Provisional Application No. 61/394,983 filed on Oct. 20, 2010, the disclosure of which is hereby incorporated by reference in its entirety.

BACKGROUND OF THE INVENTION

1. Field of the Invention

The present disclosure herein relates to a data storage device, and more particularly, to a data storage device including a reset circuit and a method of resetting thereof.

2. Description of the Related Art

A data storage device is equipped in various electronic devices such as a personal computer, a digital camera, a camcorder, a mobile phone, an MP3, a PMP, and a PDA. A volatile or nonvolatile memory device is used as a storage medium of the data storage device. For example, volatile memories such as Dynamic Random Access Memory (DRAM) and Static Random Access Memory (SRAM) and nonvolatile memories such as Electrical Erasable Programmable Read Only Memory (EEPROM), Ferroelectric Random Access Memory (FRAM), Phase-change Random Access Memory (PRAM), Magnetoresistive Random Access Memory (MRAM), and a flash memory are used as a storage medium.

Some memory devices used as a storage medium do not have an additional reset pin. For example, a 56-pin flash memory device according to a joint electron device engineering council (JEDEC) standard package method does not include a reset pin. Accordingly, Power-On-Reset (POR) is required to reset the memory devices in a reset operation. The POR means a rebooting operation of a memory device through power cut-off and supply. In a memory device without a reset pin, power control may be required to satisfy reset conditions of the memory device as a POR process.

Even when power is cut off for the POR, a level of the power of a memory device may not be sufficiently dropped to perform a reset operation. In this case, reliability of a reset operation may not be acceptable in the memory device.

SUMMARY OF THE INVENTION

The present disclosure provides a reset circuit of a data storage device to improve reliability of a reset operation of a memory device and a method of resetting thereof.

Additional aspects and advantages of the present general inventive concept will be set forth in part in the description which follows and, in part, will be obvious from the description, or may be learned by practice of the general inventive concept.

Embodiments of the inventive concept provide a data storage device including a memory device having a power terminal to receive a driving voltage, a voltage regulator to adjust an external voltage to provide the adjusted voltage to the power terminal of the memory device, and a reset circuit to discharge an enable terminal of the voltage regulator or the power terminal of the memory device according to a change of the external voltage.

The reset circuit may discharge the enable terminal of the voltage regulator or the power terminal of the memory device by detecting a rising edge of the external voltage.

The reset circuit may discharge the enable terminal or the power terminal when the external voltage becomes higher than a reference voltage at the rising edge of the external voltage.

The reset circuit may detect a rising edge of the external voltage during Power-On-Reset (POR).

The reset circuit may include: a voltage detector to generate a control signal pulse according to a change of the external voltage, and a compulsory discharge circuit to discharge the enable terminal or the power terminal in response to the control signal pulse.

The voltage detector may generate the control single pulse in response to a rising edge of the external voltage.

The compulsory discharge circuit may include a switching device to provide a ground to the enable terminal or the power terminal in response to the control signal pulse.

The data storage device may further include a current limiting device connected to between the switching device and a ground to limit a size of a discharge current.

The switching device may include an N-type metal-oxide-semiconductor (NMOS) transistor.

The data storage devices may further include an enable circuit delivering the external voltage to the enable terminal.

The memory device may be a semiconductor memory device reset by a POR method.

The data storage devices may further include an auxiliary power providing the charged external voltage as an auxiliary voltage.

The auxiliary power may include a super capacitor or a backup battery.

In other embodiments of the inventive concept, a method of resetting a data storage device including a memory device and a voltage regulator to provide a driving voltage of the memory device includes detecting a rising edge of an external voltage; generating a control signal pulse in response to the rising edge, and discharging a power terminal of the memory device during a pulse interval of the control signal pulse.

The method may further include discharging an enable terminal of the voltage regulator during the pulse interval.

The enable terminal of the voltage regulator and the power terminal of the memory device may be simultaneously discharged.

The control signal pulse may be generated at the timing of when the external voltage becomes higher than a specific level at the rising edge.

In still other embodiments of the inventive concept, a solid state drive (SSD) includes a nonvolatile memory device, a voltage regulator to adjust an external voltage to provide the adjusted voltage as a driving voltage of the nonvolatile memory device, an auxiliary power device to charge the external voltage to provide the charged voltage as an auxiliary power, and a reset circuit to discharge a power terminal of the memory device according to a change of the external voltage during POR.

The reset circuit may discharge an enable terminal of the voltage regulator during the POR.

The foregoing and/or other aspects and utilities of the present general inventive concept may also be achieved by providing a data storage device including a memory device, a voltage regulator connected to the memory device to supply a power voltage to the memory device according to an external voltage, and a reset circuit to discharge at least one of the voltage regulator and the memory device according to a characteristic of the external voltage during a power-on-reset operation.

The power voltage may be higher than a reference corresponding to a resetting of the power-on-reset operation when the external voltage is in a power off state, and the reset circuit may detect the characteristic of the external voltage after the external voltage is in the power on state from the power off state and may generate a signal to discharge at least one of an input terminal or an output terminal of the voltage regulator such that the power voltage is lower than the reference.

The memory device may perform resetting of the power-on-reset operation according to the power voltage supplied from the voltage regulator after the reset circuit discharges at least one of the voltage regulator and the memory device during the power on state of the external voltage supplied to the voltage regulator.

The data storage device may further include a power circuit to supply power as the external voltage, and the power circuit may include a main power source and an auxiliary power source having at least one of a super capacitor array and a backup battery.

The data storage device may further include a controller to control the memory device. The memory device, the voltage regulator, the reset circuit, and the controller may be installed in a housing to form a solid state drive.

The housing of the solid state drive may be detachably attached to an external host such that the controller and the voltage regulator are connected to the external host. The voltage regulator may receive the external voltage from the external host to generate the power voltage and the controller may receive a control signal from the external host to control the memory device.

The data storage device may further include a memory controller including the voltage regulator, the reset circuit, and a control unit to control the memory device. The memory device may be combined with the memory controller to form a memory card.

The memory card may be detachably attached to a computing unit to form a computing system. The computing unit of the computing system may supply the external voltage to the memory card, output a signal to the memory device, and receive data from the memory device

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 3A is a block diagram illustrating the data storage device of FIG. 2;

DETAILED DESCRIPTION OF THE PREFERRED EMBODIMENTS

Figure 1:
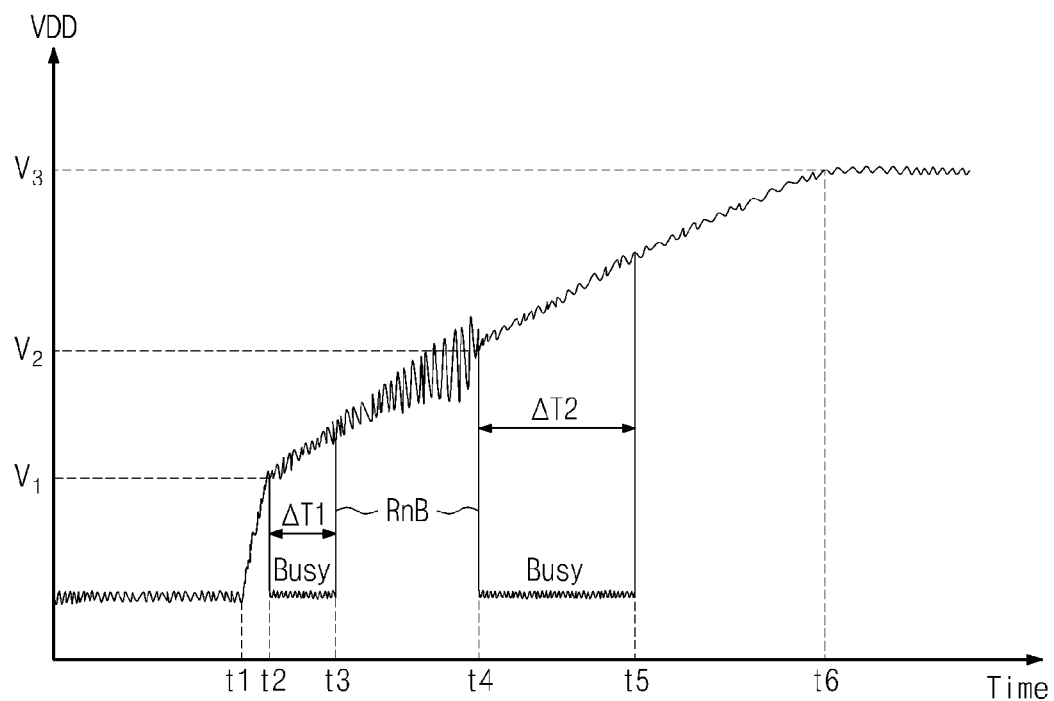
FIG. 1 is a waveform diagram illustrating a change of a power voltage VDD during Power-On-Reset (POR) of a memory device.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, a NAND flash memory device is used as one example of a semiconductor memory device to describe technical features and functions of the inventive concept. However, the technical features and functions of the inventive concept are not limited to the NAND flash memory device. The technical features and functions of the inventive concept may be applied to a typical semiconductor memory device without an additional reset pin. For example, the technical features and functions of the inventive concept may be applied to a data storage device including a volatile memory device such as DRAM or SRAM. Or, the technical features of the inventive concept may be applied to a data storage device including a nonvolatile memory device. For example, the features and functions of the inventive concept may be applied to a data storage device using at least one of memory devices such as resistive memory (such as Phase Change Random Access Memory (PRAM) or Resistance Random Access Memory (RRAM)), Nano Floating Gate Memory (NFGM), Polymer Random Access Memory (PoRAM), Magnetic Random Access Memory (MRAM), and Ferroelectric Random Access Memory (FRAM)).

However, those skilled in the art can easily understand other advantages and performances of the inventive concept according to the descriptions. The inventive concept may be embodied or applied through other embodiments. Besides, the detailed description may be amended or modified according to viewpoints and applications, not being out of the scope, technical idea and other objects of the inventive concept.

FIG. 1 is a waveform diagram illustrating a change of a power voltage VDD during Power-On-Reset (POR) of a memory device. Referring to FIG. 1, initialization of a memory device is performed before the power voltage VDD reaches a steady state voltage $V_3$ (e.g., 3.3 V).

For example, the memory device performs the initialization at a transition period of when the power voltage VDD is applied to the memory device and rises. That is, when the power voltage VDD reaches a level $V_1$ (e.g., about 1 V) at the timing t2, the memory device senses a power-on state. Once the power-on state is sensed, the memory device resets a latch circuit thereof where initialization parameters are stored to perform a reset operation. The reset operation of the latch circuit is performed during ΔT1, while the latch circuit is reset, the memory device outputs a busy (logic "LOW") state through a pin thereof, for example, an RnB pin. The RnB pin may be a pin (terminal) of a memory device (or semiconductor chip) to output a signal, for example, a busy indication signal RnB, to an external device, for example, another memory device (semiconductor chip) connected to the memory device.

Next, when the power voltage VDD reaches a level $V_2$ (e.g., about 2V) at the timing t4, the memory device reads the initialization data from an internal specific data region thereof. The memory device loads the read initialization data into the latch circuit. The initialization data reading and loading operations of the memory device are performed during ΔT2. While the initialization data are loaded, the memory device outputs a busy (logic "LOW") state through a pin, for example, the RnB pin, which notifies that an internal operation is in progress.

Once the initialization is completed, the memory device outputs a ready (logic "HIGH") state to an external device through a pin, for example, the RnB pin. After the completion of the initialization, a level of the power voltage VDD rises continuously to reach a level $V_3$ (e.g., about 3.3 V) corresponding to a steady state at the timing t6.

As mentioned above, for the stable initialization of the memory device, the power voltage VDD needs to be lower at least than the level $V_1$ of when the latch circuit starts to be reset. When considering a margin, it is preferable that a level of the power voltage VDD during the initialization drops to nearly 0 V and rises again.

However, in a data storage device using a memory device (without a reset pin) as a storage medium, it becomes more difficult to satisfy POR conditions. For example, for stable power supply, a bulk capacitor may be connected in parallel to a power voltage terminal (i.e., a VDD terminal) and a ground terminal (i.e., a GND terminal) in the data storage device. Or, a data storage device supplying a power voltage, backed up through a super capacitor, to the VDD terminal of the memory device is widely used.

For the stable power supply, discharge time of electric charges charged in capacitors is relatively long. Accordingly, it takes relatively long time for the VDD terminal's voltage in the memory device to be lower than the level $V_1$ to start the reset operation. If POR is completed before electric charges charged in the capacitors are discharged to a predetermined level, it is difficult to expect the reliability of a reset operation in the memory device. Due to characteristics of components mounted therein for stable power supply, the reliability of POR in a memory device becomes deteriorated.

The data storage device of the inventive concept includes the reset circuit to resolve the above limitations. The data storage device may secure the reliability of POR in the storage medium, even with components for the above-described stable power supply.

Figure 2:
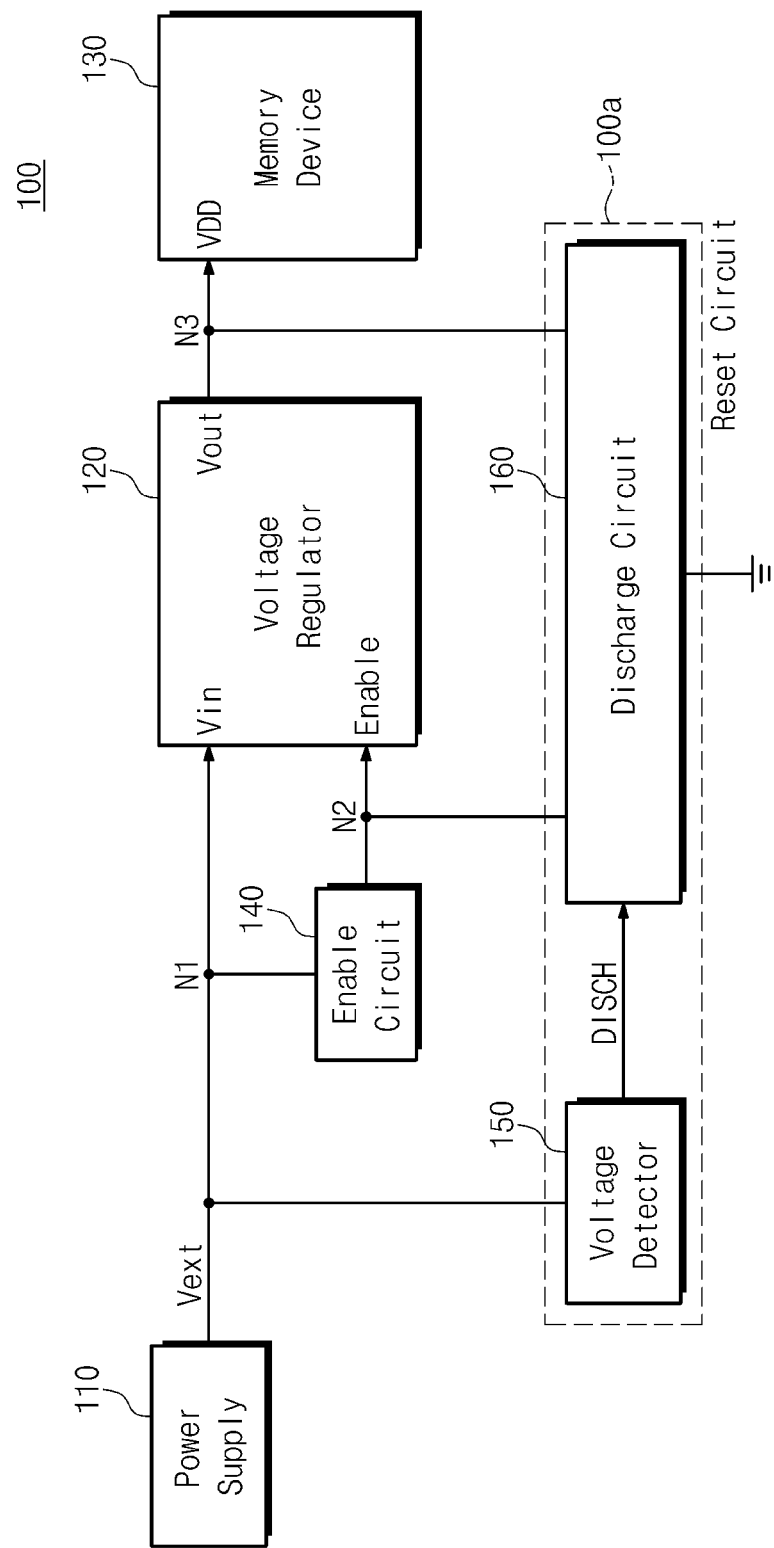
FIG. 2 is a block diagram illustrating a configuration of a data storage device according to an embodiment of the inventive concept.

FIG. 2 is a block diagram illustrating a configuration of a data storage device 100 according to an embodiment of the inventive concept. Referring to FIG. 2, the data storage device 100 includes a power supply 110, a voltage regulator 120, a memory device 130, an enable circuit 140, and a reset circuit 100a. The reset circuit 100a may control a level of a power voltage VDD in the memory device 130 to perform a stable POR according to an embodiment of the present general inventive concept.

The power supply 110 provides an external voltage Vext applied to the data storage device 100. For example, the power supply 110 may be a power pin to receive a power source as an input power provided from an external unit or apparatus of the data storage device 100. The power supply 110 may further include various kinds of auxiliary powers for backing up the input power. Here, the external voltage Vext means a power voltage provided from the external unit and apparatus of the data storage device 100. Then, the external voltage Vext may mean a power voltage provided by an auxiliary power of the data storage device 100.

The voltage regulator 120 adjusts a level (or characteristic) of the external voltage Vext provided through the power supply 110 and then supplies the adjusted voltage to the VDD terminal of the memory device 130 through a terminal as an output voltage Vout. The voltage regulator 120 steps-up or steps-down the external voltage Vext provided from the power supply 110. If the external voltage Vext is lower than a voltage level (e.g., 3.3 V) that the memory device 130 requires, the voltage regulator 120 boots the external voltage Vext and then provide the boosted voltage to the memory device 130. When the external voltage Vext is higher than the voltage level that the memory device 130 requires, the voltage regulator 120 drops the external voltage Vext to provide the dropped voltage to the VDD terminal of the memory device 130.

Additionally, the voltage regulator 120 is activated or deactivated according to an input inputted through an enable terminal thereof. If the enable terminal is deactivated, the voltage regulator 120 stops an adjustment operation for the external voltage Vext and cuts off the output voltage Vout.

The memory device 130 receives the adjusted voltage outputted from the voltage regulator 120 through the VDD terminal. The memory device 130 of the inventive concept includes a typical semiconductor memory device resettable through a control of the VDD terminal. The memory device 130 may include a nonvolatile memory device. The nonvolatile memory device is a storage device retaining data even if power is cut off and may include EEPROM, FRAM, PRAM, MRAM, RRAM, and a flash memory. The memory device 130 may include a volatile memory device resettable through a voltage control of the VDD terminal.

The enable circuit 140 senses a level of the external voltage Vext to determine whether to activate or deactivate the voltage regulator 120. The enable circuit 140 may generate a signal according to the level of the external voltage Vext and may output the signal to a terminal of the voltage regulator 120 to activate or deactivate an operation thereof. The enable circuit 140 may deactivate a voltage adjusting operation of the voltage regulator 120 when a level of the external voltage Vext is lower than a reference voltage (first reference voltage value or level). Even if a level of the external voltage Vext is unstable, a voltage adjusting operation of the voltage regulator 120 may be stabilized through the enable circuit 140.

The voltage detector 150 monitors a level of the external voltage Vext. The voltage detector 150 outputs a control signal, for example, a control signal pulse DISCH, to control a discharge circuit (or a compulsory discharge circuit unit) 160 if a level of the external voltage Vext changes into a level corresponding to POR. For example, the voltage detector 150 senses a rising edge of the external voltage Vext to output a control signal pulse DISCH. Or, the voltage detector 150 senses that the external voltage Vext reaches a reference voltage (second reference voltage level or value) at the rising edge of the external voltage Vext and then outputs the control signal pulse DISCH. A detection operation for the external voltage Vext of the voltage detector 150 is not limited to the above description and may be diversely realized.

The compulsory discharge circuit 160 discharges the enable terminal of the voltage regulator 120 and the VDD terminal of the memory device 130 in response to the control signal pulse DISCH. Once the control signal pulse DISCH is provided, the compulsory discharge circuit 160 discharges the enable terminal of the voltage regulator 120 and the VDD terminal of the memory device 130 at the pulse duration of the control signal pulse DISCH.

Here, the voltage detector 150 and the compulsory discharge circuit 160 may constitute a reset circuit 100*a*. That is, the reset circuit 100*a* may discharge the enable terminal of the voltage regulator 120 and the VDD terminal of the memory device 130 for a predetermined time corresponding to the control signal pulse DISCH at the POR interval of the memory device 130. The reset circuit 100*a* may refresh the VDD terminal of the memory device 130 and the enable terminal of the voltage regulator 120 to allow the POR to operate normally when the external voltage Vext does not drop sufficiently.

The data storage device 100 according to an embodiment of the inventive concept may perform a stable POR of the memory device 130 even if the external voltage Vext does not sufficiently drop.

FIG. 3A is a block diagram illustrating the data storage device of FIG. 2 in detail. Referring to FIG. 3, the data storage device 200 includes a power supply 210, a voltage regulator 220, a memory device 230, an enable circuit 240, a voltage detector 250, and a compulsory discharge circuit 260. Here, the power supply 210, the voltage regulator 220, and the memory device 230 are substantially the same as the power supply 110, the voltage regulator 120, the memory device 130, the enable circuit 140, the voltage detector 150, and the discharge circuit 160 of FIG. 2, and thus descriptions thereof will be omitted.

The enable circuit 240 controls an enable terminal of the voltage regulator 220 according to a level of the external voltage Vext. The enable circuit 240 may include a resistor Ra and a capacitor Ca. The external voltage Vext provided from the power supply 210 passes through the resistor Ra and then is inputted into the enable terminal of the voltage regulator 220. The capacitor Ca is charged by a voltage provided to the enable terminal through the resistor Ra. Even if a level change of the external voltage Vext occurs in a certain pattern, a voltage of the enable terminal may be stably maintained by the capacitor Ca.

The voltage detector 250 monitors a level of the external voltage Vext. When the voltage detector 250 detects a level change of the external voltage Vext caused by POR. The voltage detector 250 may sense POR of the data storage device 200 by detecting a rising edge of the external voltage Vext. The voltage detector 250 generates a control signal pulse DISCH when a rising voltage of the external voltage reaches a specific level or is higher than the specific level.

At this point, the compulsory discharge circuit 260 discharges the enable terminal of the voltage regulator 220 and the VDD terminal of the memory device 230 in response to the control signal pulse DISCH. As the enable terminal is discharged, a voltage adjustment of the voltage regulator 220 and an output of the adjusted voltage are cut off. Then, the VDD terminal of the memory device 230 may be discharged by the compulsory discharge circuit 260.

A bulk capacitor Cb may be connected to the VDD terminal of the memory device 230 to provide power integrity. The compulsory discharge circuit 260 discharges electric charges charged in the bulk capacitor Cb to initialize the VDD terminal of the memory device 230. Accordingly, a voltage of the VDD terminal allows the memory device 230 to perform a steady POR operation.

The data storage device 200 according to an embodiment of the inventive concept may perform a stable POR of the memory device 230 even if the external voltage Vext does not sufficiently drop.

Figure 3B:
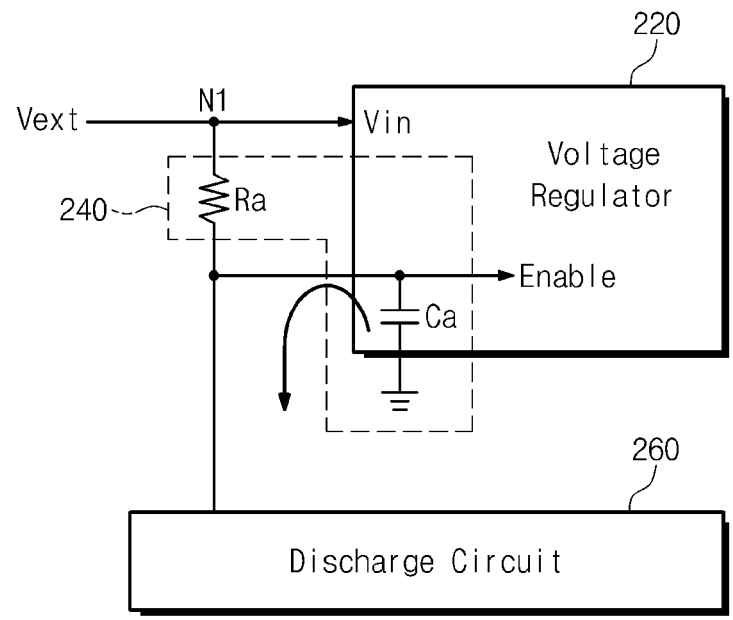
FIGS. 3B, 3C, and 3D are view illustrating a discharge path of a data storage device.

Referring to FIG. 3B, the capacitor Ca of the enable circuit 240 may be disposed in the voltage regulator 220. In this case, the enable circuit 240 may be formed as a portion of the voltage regulator 220. Accordingly, a discharge path may be formed from the capacitor Ca of the voltage regulator 220 through the enable terminal of the voltage regulator 220 according to the control signal pulse DISCH.

Figure 3C:
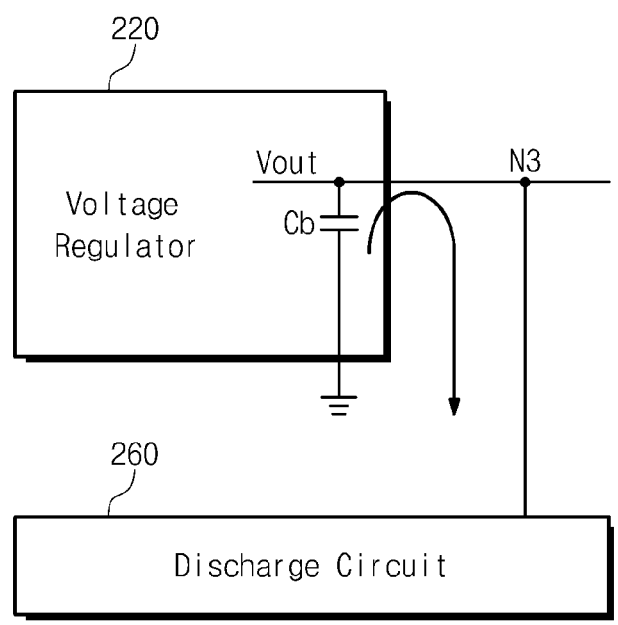

Referring to FIG. 3C, the capacitor Cb may be disposed in the voltage regulator 220. In this case, a discharge path may be formed from the capacitor Cb of the voltage regulator 220 through the terminal of the voltage regulator 220 according to the control signal pulse DISCH.

Figure 3D:
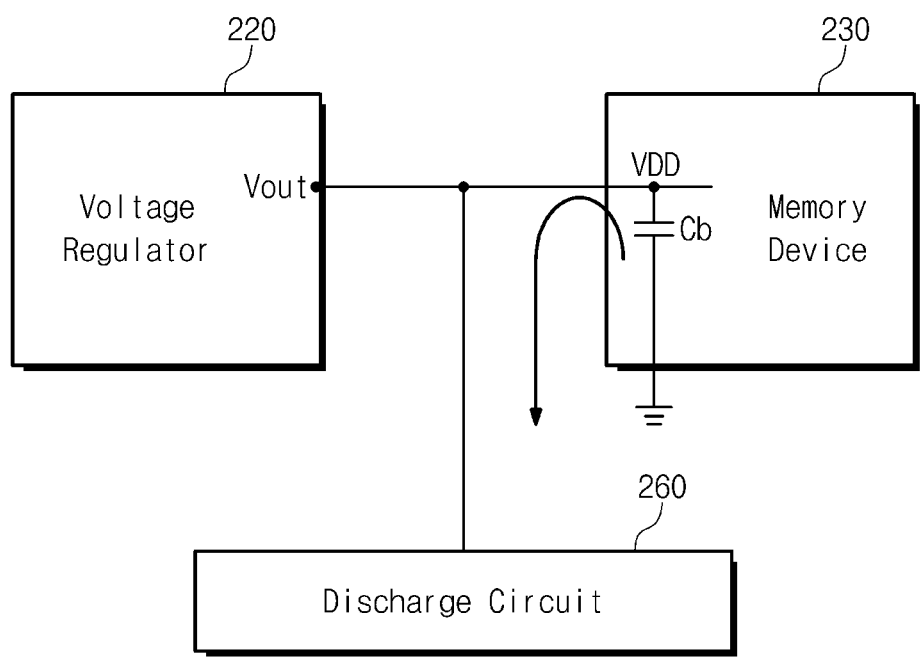

Referring to FIG. 3D, the capacitor Cb may be disposed in the memory device 230. In this case, a discharge path may be formed from the capacitor Cb of the memory device 230 through the terminal VDD according to the control signal pulse DISCH.

Figure 4:
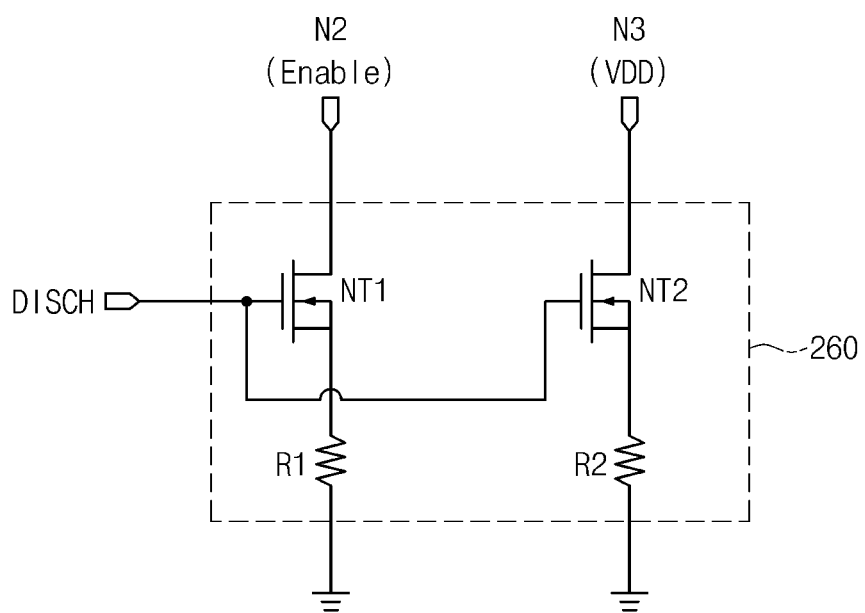
FIG. 4 is a circuit diagram illustrating the compulsory discharge circuit 260 of FIG. 3.

FIG. 4 is a circuit diagram illustrating the compulsory discharge circuit 260 of FIG. 3 as an example. Referring to FIG. 4, the compulsory discharge circuit 260 includes switching devices NT1 and NT2 and current limiting devices R1 and R2.

The compulsory discharge circuit 260 includes the first switching device NT1 and the first current limiting device R1. The first switching device NT1 is turned on or off in response to the control signal pulse DISCH provided from the voltage detector 250. If the first switching device NT1 is turned on, the enable terminal of the voltage regulator 220 is connected to a ground through the first current limiting device R1.

If POR is detected by the voltage detector 250, the activated control signal pulse DISCH is provided to the first switching device NT1. The first switching device NT1 is turned on during the pulse interval of the control signal pulse DISCH. At this point, electric charges charged in the enable terminal of the voltage regulator 220 are discharged. The first current limiting device R1 is a device for limiting a size of a discharge current.

The compulsory discharge circuit 260 includes the second switching device NT2 and the second current limiting device R2. The second switching device NT2 is turned on or off in response to the control signal pulse DISCH provided from the voltage detector 250. If the second switching device NT2 is turned on, a Vout terminal of the voltage regulator 220 or the VDD terminal of the memory device 230 is connected to a ground through the second current limiting device R2.

If POR is detected by the voltage detector 250, the activated control signal pulse DISCH is provided to the second switching device NT2. The second switching device NT2 is turned on during the pulse interval of the control signal pulse DISCH. At this point, the Vout terminal of the voltage regulator 220 or the VDD terminal of the memory device 230 is connected to the ground through the second current limiting device R2. Then, the VDD terminal's voltage of the memory device 230 drops to a lower level than the initial voltage $V_1$ of FIG. 1.

Since the enable terminal of the voltage regulator 260 is discharged by the compulsory discharge circuit 260, the voltage regulator 360 is deactivated. Then, the Vout terminal's voltage of the voltage regulator 260 may be cut off. Accordingly, a voltage supplying operation of the voltage regulator 220 is cut off during a pulse interval of the control signal pulse DISCH, and the VDD terminal of the memory device 230 may be grounded.

Here, the switching devices NT1 and NT2 are realized with an N-type metal-oxide-semiconductor (NMOS) field-effect transistor (FET), but the inventive concept is not limited thereto. The switching devices NT1 and NT2 may be various active devices to perform a switching operation in response to the control signal DISCH. Then, the switching devices NT1 and NT2 may a single switching device. Additionally, the current limiting devices R1 and R2 may be a resistance device and may be selectively inserted, if necessary.

Figure 5:
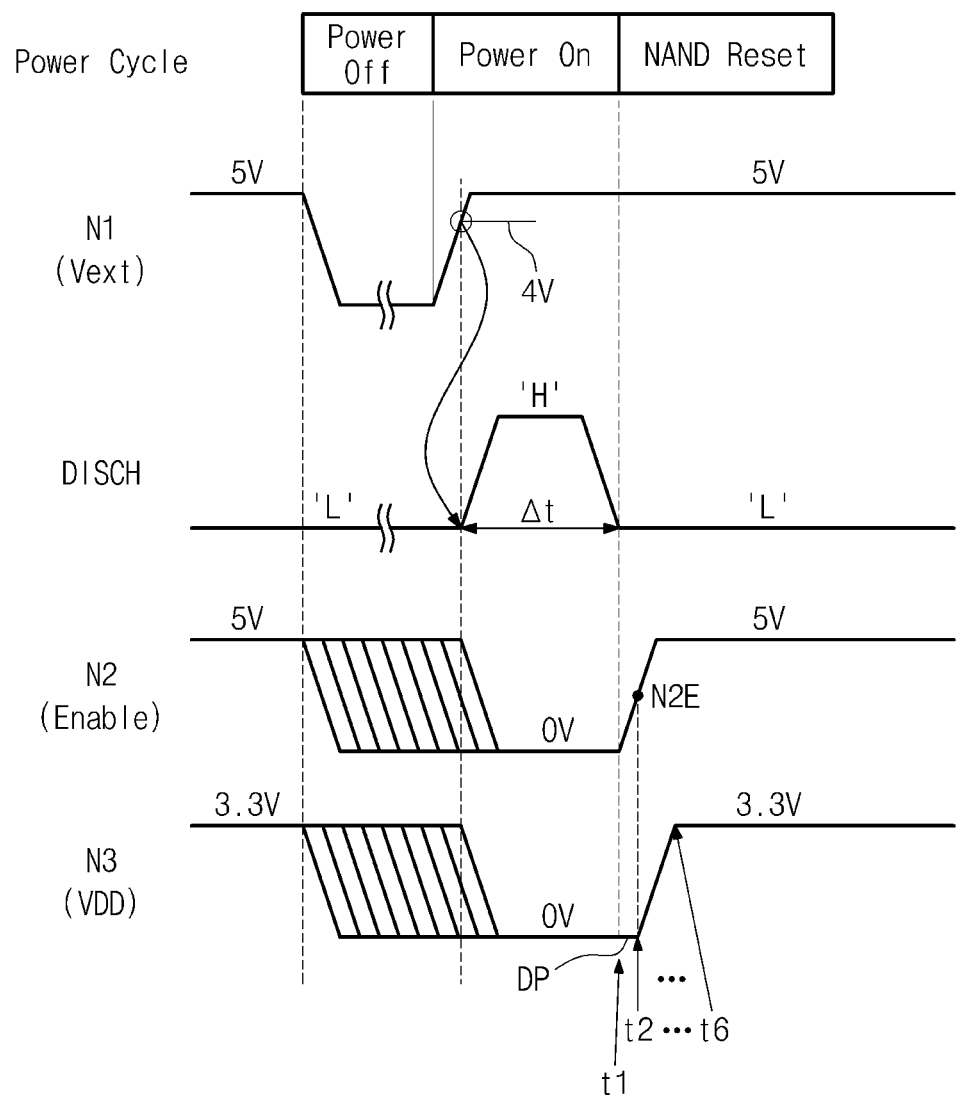
FIG. 5 is a waveform diagram illustrating POR briefly by the compulsory discharge circuit 260 of FIG. 3.

FIG. 5 is a waveform diagram illustrating POR to be performed by the compulsory discharge circuit 260 of FIG. 3A. Referring to FIGS. 3A and 5, the data storage device 200 controls the power supply 210 to cut off and resupply power when a reset operation is necessary. Then, POR of the memory device 230 starts by the voltage detector 250 and the compulsory discharge circuit 260 according to an embodiment of the inventive concept.

Once external power is powered off, the external voltage Vext applied to the first node N1 drops first. However, an auxiliary power supply may be equipped in the power supply 210 in addition to a main power supply thereof. For example, a super capacitor or a backup battery may be included in the power supply 210. In this case, even when the external power of the data storage device 200 is cut off, the output voltage Vext of the power supply 210 is slowly lowered compared to a power off operation of the main power supply. Accordingly, voltages of a second node N2 (i.e., an output terminal of the enable circuit 240) and a third node N3 (i.e., the VDD terminal of the memory device 230) may be maintained more than a predetermined level for a predetermined time after the external power is powered off.

When the external power is powered on again, a level of the external voltage Vext applied to the first node N1 is increased. The voltage detector 250 of FIG. 3 of the inventive concept detects a rising edge of the external voltage Vext. Even when the level of the external voltage Vext does not drop sufficiently, POB can be performed according to the detected rising edge of the external voltage Vext according to an embodiment of the present general inventive concept. If the external voltage Vext drops to a lower level than a reference voltage (e.g., 4V) that the voltage detector 250 detects at a rising edge, POR is normally performed. The voltage detector 250 activates (logic "HIGH") the control signal pulse DISCH when the external voltage Vext reaches a reference voltage (e.g., 4 V).

The control signal pulse DISCH may be activated during a time corresponding to a pulse width Δt. Once the control signal pulse DISCH is activated, the compulsory discharge circuit 260 discharges the enable terminal of the voltage regulator 220 and the VDD terminal of the memory device 230. Then, electric charges remaining in the enable terminal of the voltage regulator 220 and the VDD terminal of the memory device 230 may be rapidly discharged. Accordingly, an output of a voltage adjusted by the voltage regulator 220 may be cut off. Moreover, the VDD terminal of the memory device 230 may drop nearly to 0 V.

When the control signal pulse DISCH is deactivated (or, logic "LOW"), a discharge operation of the compulsory discharge circuit 260 stops. Then, the voltage of the enable terminal of the voltage regulator 220 rises by the enable circuit 240 and then, the voltage regulator 220 may be activated. Then, a voltage adjusted by the voltage regulator 220 may be provided to the VDD terminal of the memory device. Then, the memory device 230 may start POR. After the voltage of the VDD terminal of the memory device 230 reaches nearly to 0V, it rises again. Accordingly, a reset operation of a latch circuit for storing initialization parameters or a load operation of the initialization parameters may be executed according to an embodiment of the present general inventive concept. As a result, reliability for POR of the memory device 230 may be secured.

After the enable terminal of the voltage regulator 220 or a voltage at the second node N2 is discharged according to the control signal pulse DISCH, the capacitor Ca of the enable circuit 240 may be charged, and then the enable circuit 240 may generate an enable signal at time N2E to the enable terminal of the voltage regulator 220 so that the power voltage VDD is generated at the third node N3.

Referring to FIGS. 1 and 5, a level of the power voltage VDD of FIG. 1 may be detected at time t1 through t6 at the third node N3 after discharging according to the control signal pulse DISCH. It is possible that the voltage regulator 220 may generate the power voltage VDD at least the time t1 in a period DP after discharging thereof.

When the discharge circuit 160 discharges the enable terminal of the voltage regulator 120 according to the control signal pulse DISCH, it is possible that the enable circuit 140 can also be discharged during the pulse duration of the control signal pulse DISCH. Accordingly, the enable circuit 140 may not generate an enable signal to enable the voltage regulator 120 until the end of the pulse duration of the control signal pulse DISCH. The pulse duration of the control signal pulse DISCH may be set to expire so that a desirable or required discharging operation is performed, or so that the voltage regulator 120 can timely supply the output voltage Vout to the memory device 130 for the initialization and reset operation and a normal operation for data reading, writing, and erasing of the memory device 130.

It is possible that the discharge circuit 160 may generate a first control signal pulse DISCH1 having a first pulse duration and a second control signal pulse DISCH2 having a second pulse duration. The first control signal pulse DISCH1 having a first pulse duration may be applied to a junction N2, and the second control signal pulse DISCH2 having the second pulse duration may be applied to a junction N3. The first control signal pulse DISCH1 may be the same as the second control signal pulse DISCH2. However, the present general inventive concept is not limited thereto. The first control signal pulse DISCH1 may be different from the second control signal pulse DISCH2 according to a difference between discharging times thereof or a difference between levels of the discharging voltage. It is also possible that the first control signal pulse DISCH1 and the second control signal pulse DISCH2 may be simultaneously generated or selectively generated according to a design of the data storage device 100 or a user preference.

Figure 6:
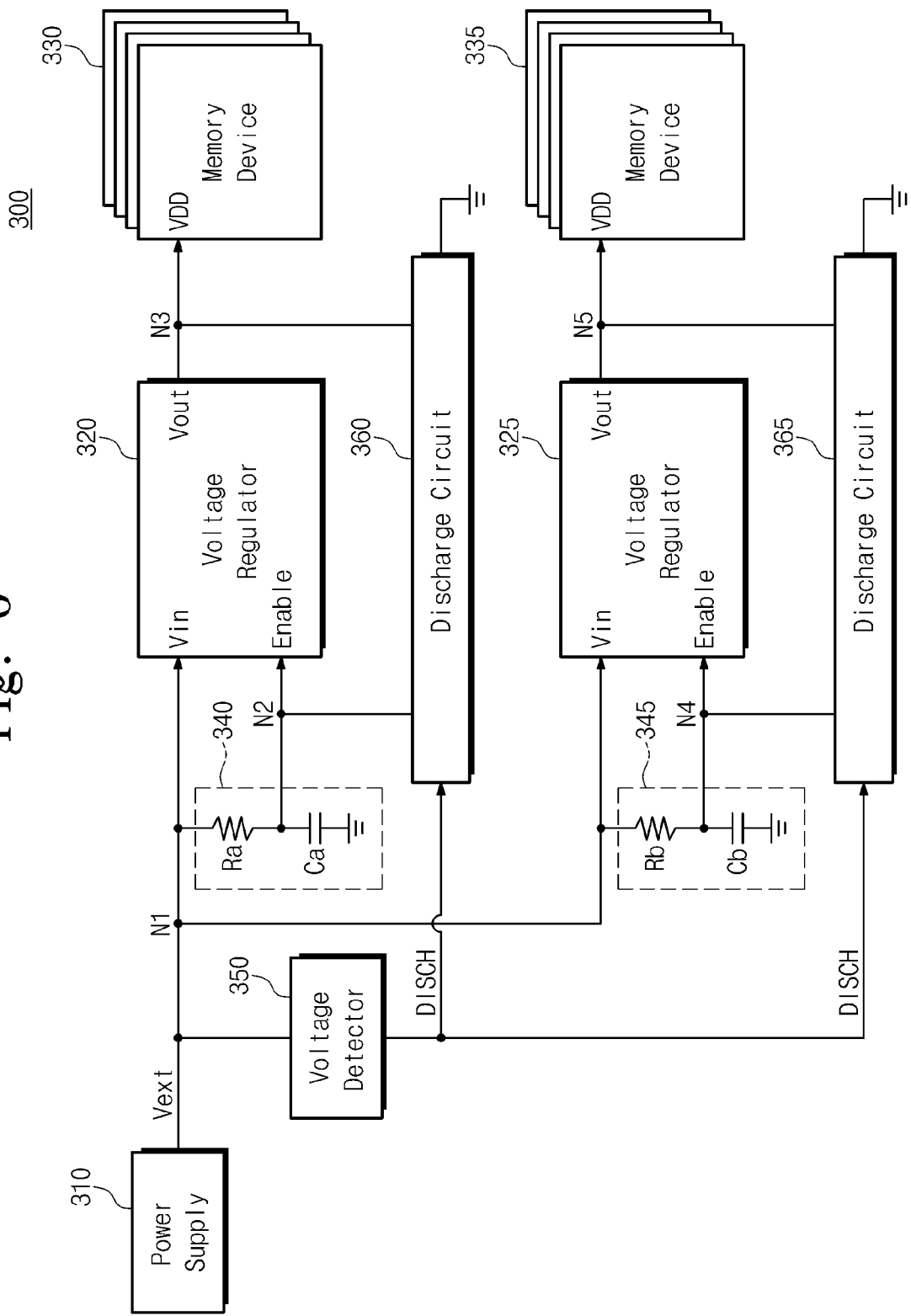
FIG. 6 is a block diagram illustrating a storage device 300 according to an embodiment of the inventive concept.

FIG. 6 is a block diagram illustrating a storage device 300 according to another embodiment of the inventive concept. Referring to FIG. 6, the data storage device 300 may include a plurality of compulsory discharge circuits 360 and 365. A high capacity data storage device, such as a solid state drive (SSD), may further include a plurality of memory devices to increase to their storage capacity. At this point, a plurality of voltage regulators 320 and 325 may be included to supply power to a number of memory devices 330 and 335. A plurality of compulsory discharge circuits 360 and 365 are required to compulsorily discharge the enable terminal and Vout terminal of the plurality of voltage regulators 320 and 325.

The data storage device 300 includes a power supply 310, voltage regulators 320 and 325, memory devices 330 and 335, enable circuits 340 and 345, a voltage detector 350, and compulsory discharge circuits 360 and 365. Here, configurations and functions of the power supply 310, the voltage regulators 320 and 325, the memory devices 330 and 335, the enable circuits 340 and 345, the voltage detector 350, and the compulsory discharge circuits 360 and 365 are substantially the same as those of FIG. 3. Accordingly, descriptios thereof will be omitted.

When a change of the external voltage Vext is detected, the voltage detector 350 outputs a control signal pulse DISCH. For example, the voltage detector 350 may activate the control signal pulse DISCH for a predetermined time by detecting a rising edge of the external voltage Vext. Or, the voltage detector 350 may activate the control signal pulse DISCH when the external voltage Vext rises and exceeds a reference voltage (e.g., 4 V).

While the control signal pulse DISCH is activated, the compulsory discharge circuits 360 and 365 provide a potential, for example, a ground, to each enable terminal of the voltage regulators 320 and 325. Then, while the control signal pulse DISCH is activated, the compulsory discharge circuits 360 and 365 provide a potential, for example, a ground, to each VDD terminal of the memory devices 330 and 335. Then, the memory devices connected to the respectively different voltage regulators 320 and 325 may simultaneously perform POR.

According to the embodiment described with reference to FIG. 6, the plurality of compulsory discharge circuits 360 and 365 may be simultaneously controlled by the control signal pulse DISCH generated from one voltage detector 350. Accordingly, reliability of POR of the data storage device 300 providing power to the memory devices 330 and 335 through the plurality of voltage regulators 320 and 325 may be improved.

Figure 7:
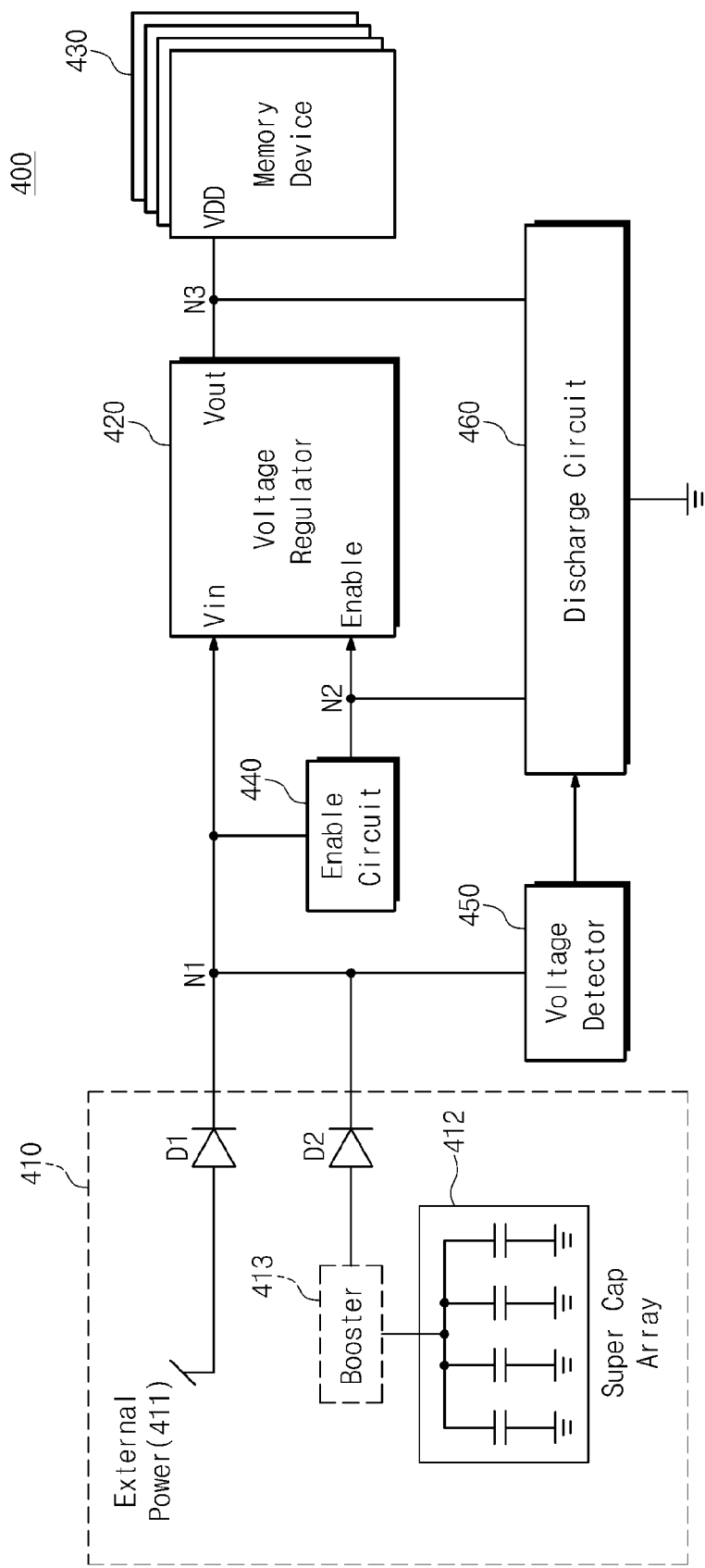
FIG. 7 is a block diagram illustrating a data storage device according to an embodiment of the inventive concept.

FIG. 7 is a block diagram illustrating a data storage device 400 according to an embodiment of the inventive concept. Referring to FIG. 7, the data storage device 400 includes a power circuit 410, a voltage regulator 420, a memory device 430, an enable circuit 440, a voltage detector 450, and a compulsory discharge circuit 460. Here, configurations and functions of the voltage regulator 420, the memory device 430, the enable circuit 440, the voltage detector 450, and the compulsory discharge circuit 460 are substantially the same as those of FIG. 3. Thus, descriptions thereof will be omitted.

The power supply 410 may include an auxiliary power supply in addition to an external power 411 to obtain power integrity. A voltage provided from the external power 411 is supplied in a unidirectional way to the voltage regulator 420 through a diode D1.

A super capacitor 412 may be used as the auxiliary power supply. The super capacitor 412 is a power back up device retaining high capacity charges. The super capacitor 412 may charge electric charges during a power up or normal operation of the data storage device 400. The super capacitor 412 may provide voltage to the data storage device 400 using charged electrical charges. The super capacitor 412 may have an array structure in which a plurality of super capacitors are connected in parallel or series.

When a voltage is provided from electric charges charged in the super capacitor 412, a booster 413 may be included in the power supply to raise a level of a voltage charged in the super capacitor 412. A level-changed voltage by the booster 413 may be supplied in a unidirectional way to the voltage regulator 420 through a diode D2.

According to this configuration, even if the external power 411 is cut off, the power supply 410 may supply a voltage higher than a predetermined level for a predetermined time by the super capacitor 412. Accordingly, electric potentials of the Vin terminal Vin and the enable terminal of the voltage regulator 420 may be maintained higher than a predetermined level. These features may deteriorate reliability of POR of the memory device 430. However, these limitations may be resolved by the power detector 450 and the compulsory circuit 460 of the inventive concept.

The power detector 450 activates the compulsory discharge circuit 460 for a predetermined time by detecting a voltage's rising edge of the first node N1. Then, voltage of the enable terminal of the voltage regulator 420 and the voltage of the VDD terminal of the memory device 430 drop to nearly 0 V. When the compulsory discharge circuit 460 is deactivated again, the enable terminal's voltage of the voltage regulator 420 rises. Also, a voltage adjusting operation of the voltage regulator 420 is activated and the VDD terminal's voltage of the memory device 430 rises again. As the VDD terminal's voltage rises, the memory device 430 may perform self-running POR.

Figure 8:
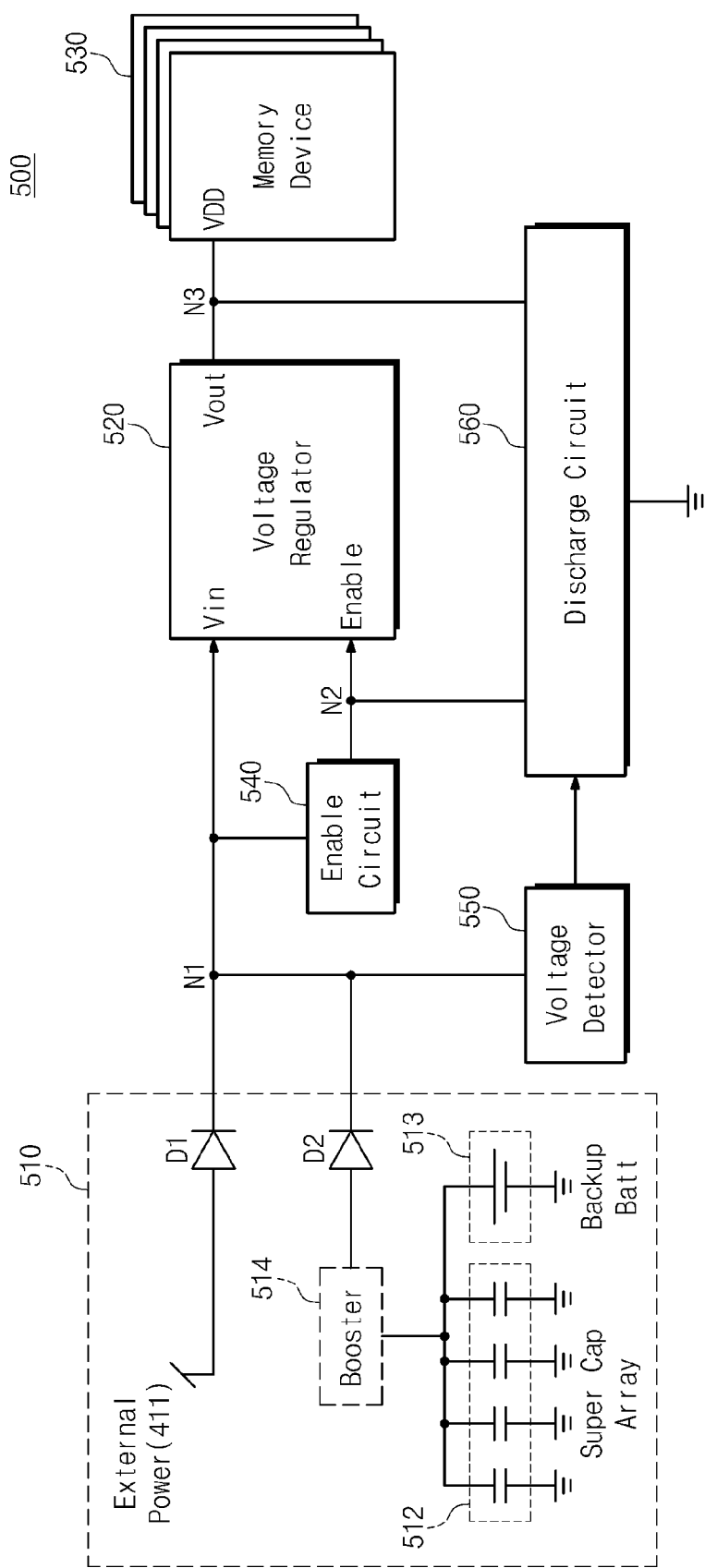
FIG. 8 is a block diagram illustrating a data storage device according to an embodiment of the inventive concept.

FIG. 8 is a block diagram illustrating a data storage device according to an embodiment of the inventive concept. Referring to FIG. 8, the data storage device 500 includes a power circuit 510, a voltage regulator 520, a memory device 530, an enable circuit 540, a voltage detector 550, and a compulsory discharge circuit 560. Here, configurations and functions of the voltage regulator 520, the memory device 530, the enable circuit 540, the voltage detector 550, and the compulsory discharge circuit 560 are substantially the same as those of FIG. 3. Thus, descriptions thereof will be omitted.

The power supply 510 may include an additional auxiliary power supply besides an external power 511 to obtain power integrity. A voltage provided from the external power 511 is delivered in a unidirectional way to the voltage regulator 520 through a diode D1.

As an auxiliary power supply, a super capacitor 512 and a backup battery 513 may be mounted. The super capacitor 412 is a power back up device retaining high capacity charges. The backup battery 513 is an auxiliary power to prevent data damage of the data storage device 500 in a situation of sudden power off of the external power 511. A booster may be used to raise an output voltage of the super capacitor 512 and the backup battery 513 to an appropriate level. The booster 514 may not be included in the data storage device 500.

According to the above configuration, the power supply 510 may output a voltage of a more than a predetermined level for a predetermined time (several seconds to several minutes) even if the external power 511 is cut off. Accordingly, voltages of the Vin terminal and the enable terminal of the voltage regulator 520 may be maintained more than a predetermined level. These features may deteriorate reliability of POR of the memory device 530. However, these limitations may be resolved by the power detector 550 and the compulsory discharge circuit 560 of the inventive concept.

The power detector 550 activates the compulsory discharge circuit 560 for a predetermined time by detecting a voltage's rising edge of the first node N1. Then, the voltage of the enable terminal of the voltage regulator 520 and the voltage of the VDD terminal of the memory device 530 drop to nearly 0 V. When the compulsory discharge circuit 560 is deactivated again, the voltage of the enable terminal of the voltage regulator 520 rises. Also, a voltage adjusting operation of the voltage regulator 520 is activated and the voltage of the VDD terminal of the memory device 530 rises again. As the voltage of the VDD terminal rises, the memory device 530 may perform self-running POR.

Figure 9:
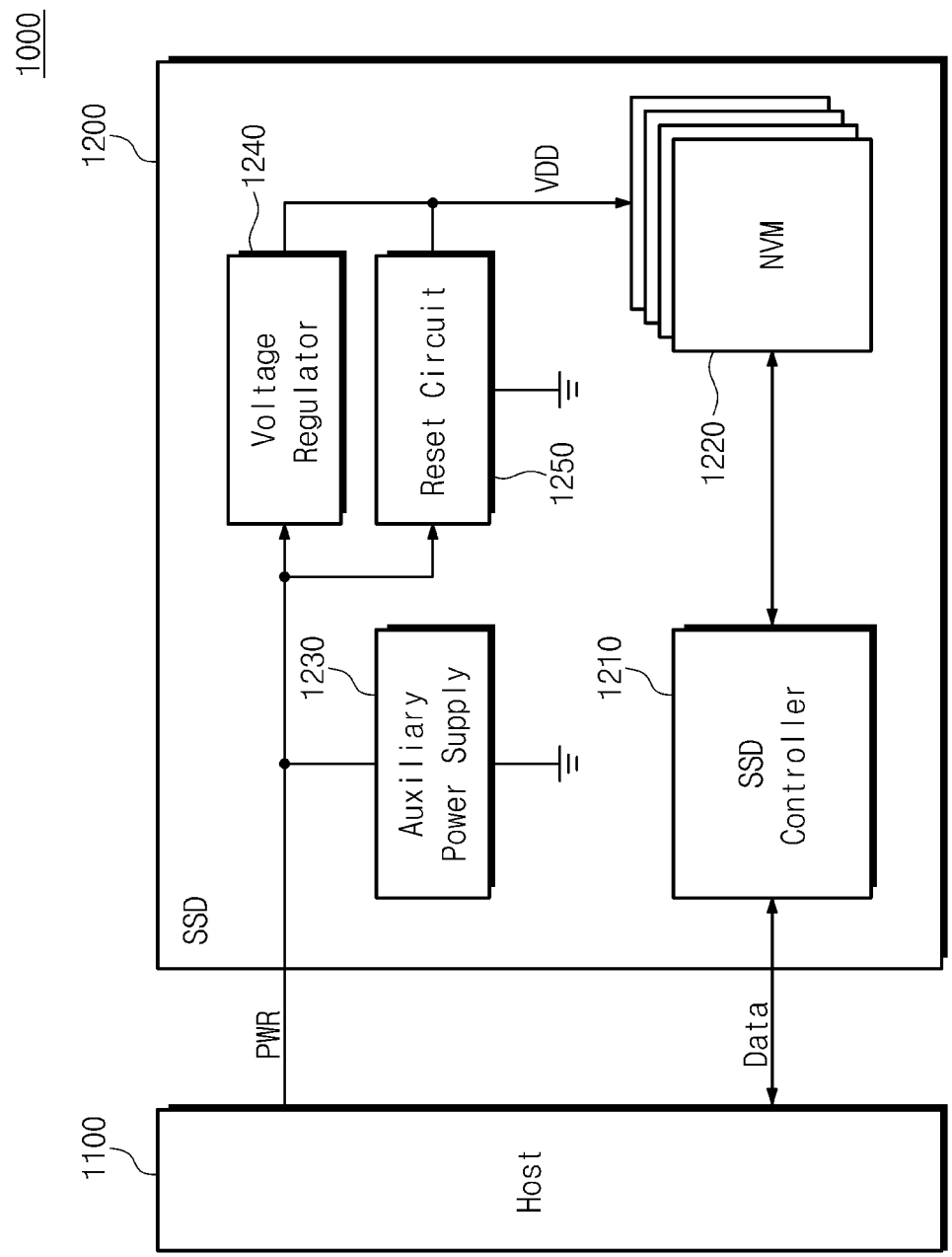
FIG. 9 is a block diagram illustrating a SSD system including a reset circuit.

FIG. 9 is a block diagram illustrating an SSD system including a reset circuit. Referring to FIG. 9, the SSD system 1000 includes a host 1100 and an SSD 1200. The SSD 1200 includes an SSD controller 1210, a nonvolatile memory device 1220, an auxiliary power supply 1230, a voltage regulator 1240, and a reset circuit 1250.

The SSD controller 1210 provides a physical connection between the host 1100 and the SSD 1200. That is, the SSD controller 1210 provides interfacing with the SSD 1200, which corresponds to a bus format of the host 1100. The SSD controller 1210 decodes a command provided from the host 1100. According to a decoded result, the SSD controller 1210 accesses the nonvolatile memory device 1220. The bus format of the host 1100 includes a universal serial bus (USB), a small computer system interface (SCSI), a PCI express, ATA, a parallel ATA (PATA), a serial ATA (SATA), and a serial attached SCSI (SAS).

The nonvolatile memory device 1220 is provided as a storage medium of the SSD 1200. For example, the nonvolatile memory device 1220 may be a NAND-type flash memory having the ability to store high capacity. The nonvolatile memory device 1220 may be a plurality of memory devices. In this case, each of the memory devices is connected to the SSD controller 1210 by a channel unit.

Although the nonvolatile memory device 1220 is described with an example of a NAND flash memory as a storage medium, it may be other nonvolatile memory devices. For example, PRAM, MRAM, ReRAM, FRAM, and NOR flash memory are used as a storage medium and a memory system including different kinds of memory devices may be used. A volatile memory device (e.g., DRAM) as a storage medium may be included. Moreover, typical memory devices performing POR according to a voltage of the VDD terminal may be used as a storage medium of the SSD 1200 according to the inventive concept.

The auxiliary power supply 1230 is a power circuit to control or supply power to a voltage regulator 1240 using external power PWR provided from the host 1100 to supply power to a voltage regulator 1240. The auxiliary power supply 1230 may include a super capacitor or a backup battery. The auxiliary power supply 1230 charges electric charges provided to the external power PWR in a normal operating mode. Moreover, in case that the external power PWR is cut off or unstable, voltage charged in the voltage regulator 1240 may be provided.

The voltage regulator 1240 adjusts a voltage provided from the external power PWR or the auxiliary power supply 1230. The voltage regulator 1240 provides the adjusted voltage as a power voltage VDD of the nonvolatile memory device 1220. Here, although not shown, the voltage regulator 1240 has an enable terminal. According to a level of the enable terminal, the voltage regulator 1240 may be activated or deactivated.

The reset circuit 1250 detects a voltage provided from the external power PWR or the auxiliary power supply 1230. The reset circuit 1250 discharges an enable terminal (not illustrated) and an output terminal of the voltage regulator 1250 for a predetermined time when the detected voltage corresponds to POR. The reset circuit 1250 may include a voltage detector or a compulsory discharge circuit. The voltage detector detects a voltage provided from the external power PWR or the auxiliary power supply 1230. The compulsory discharge circuit grounds the enable terminal and the output terminal of the voltage regulator 1240 according to a detected result.

According to the SSD system 1000, reliability is provided to initialization of the nonvolatile memory device 1220 that is reset according to a POR procedure. The reset circuit 1250 may include one chip and may be mounted in the SSD 1200.

Figure 10:
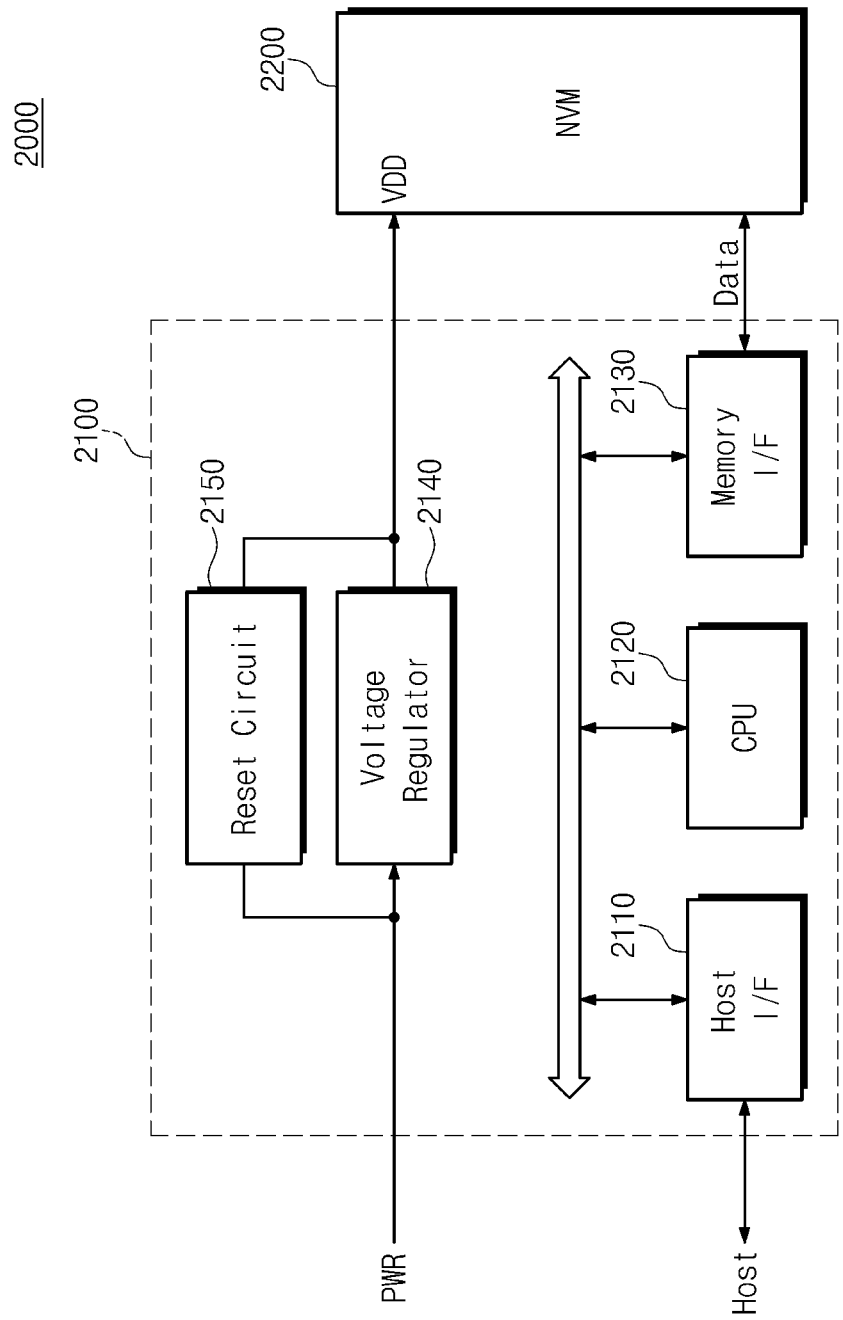
FIG. 10 is a block diagram illustrating a memory system 2000 according to an embodiment of the inventive concept.

FIG. 10 is a block diagram illustrating a memory system 2000 briefly according to an embodiment of the inventive concept. Referring to FIG. 10, the memory system 2000 includes a nonvolatile memory device 2200 and a memory controller 2100.

The memory controller 2100 is configured to control the nonvolatile memory device 2200. The memory controller 2100 combined with the nonvolatile memory device 220 may be used as a memory card. The host interface 2110 includes an exchange protocol of a host connected to the memory system 2000. A central processing unit (CPU) 2120 controls general operations of the memory controller 2100. The memory interface 2130 provides interfacing between the nonvolatile memory device 2200 and the memory controller 2100. The host interface 2110, central processing unit (CPU) 2120, and memory interface 2130 may be formed as a control unit to control the regulator 2140*o* and the memory device 2200.

The voltage regulator 2140 adjusts a voltage level of the external power PWR provided. The voltage regulator 2140 provides the adjusted voltage to a VDD terminal of the nonvolatile memory device 2200. Although not shown, the voltage regulator 2140 has an enable terminal. According to a level of the enable terminal, the voltage regulator 2140 may be activated or deactivated.

The reset circuit 2150 detects a voltage provided from the external power PWR or the auxiliary power (not illustrated). The reset circuit 2150 discharges an enable terminal (not illustrated) and an output terminal of the voltage regulator 2140 for a predetermined time when the detected voltage corresponds to POR. The reset circuit 2150 may include a voltage detector or a compulsory discharge circuit. The voltage detector detects a voltage provided from the external power PWR or the auxiliary power (not illustrated). The compulsory discharge circuit grounds the enable terminal and the output terminal of the voltage regulator 2140 according to a detected result.

Although not illustrated, the memory system 2000 may further include an auxiliary power to obtain power integrity. For example, a super capacitor or a backup battery may be mounted on the front end of the voltage regulator 2140.

Besides, the memory controller 2100 may further include an SRAM (not illustrated) used as an operating memory of the CPU 2120, a ROM (not illustrated) storing code data, and an error correction code (ECC) block for detecting and correcting an error.

The nonvolatile memory device 2200 may be provided as a multi-chip package consisting of a plurality of flash memory chips. The memory controller 2100 may be configured to communicate with the external (e.g., a host) through one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Figure 11:
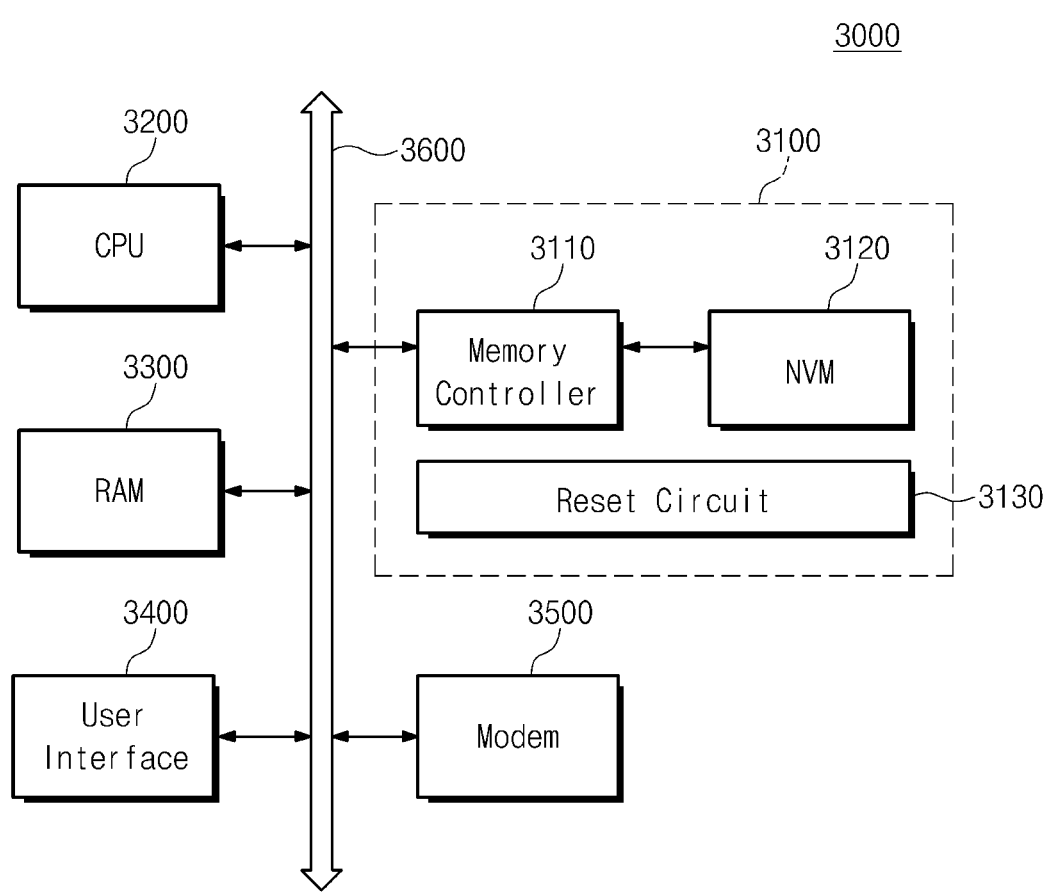
FIG. 11 is a view illustrating a computing system 3000 with a data storage device 3100.

FIG. 11 is a view illustrating a computing system 3000 with a data storage device 3100. The computing system 3000 includes a CPU 3200, a RAM 3300, a user interface 3400, a modem 3500 such as a baseband chipset, and a data storage device 3100. The CPU 3200, RAM 3300, user interface 3400, and modem 3500 may be formed as a computing unit. The data storage device 3100 may be detachably attached to the computing unit to form the computing system 3000.

The data storage device 3100 may be substantially the same as the SSD 1200 of FIG. 9 or the memory system 2000 of FIG. 10. The data storage device 3100 may include a memory controller 3110, a flash memory device 3120, and a reset circuit 3130. The reset circuit 3130 monitors power of the data storage device 3100. The reset circuit 3130 detects a rising edge of power during a POR operation of the data storage device 3100 thereby discharging an enable terminal and an output terminal of a voltage regulator (not illustrated) for a predetermined time.

The data storage device 3100 including the reset circuit 3130 according to an inventive concept may perform stable POR, if necessary. Accordingly, even if an external voltage does not sufficiently drop by the auxiliary power or other means, the data storage device 3100 may stably reset the nonvolatile memory device 3120. Accordingly, operations and data reliability of the computing system 3000 may be improved.

When the computing system 3000 is a mobile device, a battery (not illustrated) for supplying an operating voltage of the computing system 3000 may be additionally provided. Although not shown in the drawings, it is apparent to those skilled in the art that the computing system 3000 may further include an application chipset, a camera image processor (CIS), and a mobile DRAM.

A memory device, a voltage regulator, a reset circuit, or a memory controller according to an inventive concept may be mounted using various kinds of packages. For instance, the memory device 100 according to an inventive concept may be mounted through packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 12:
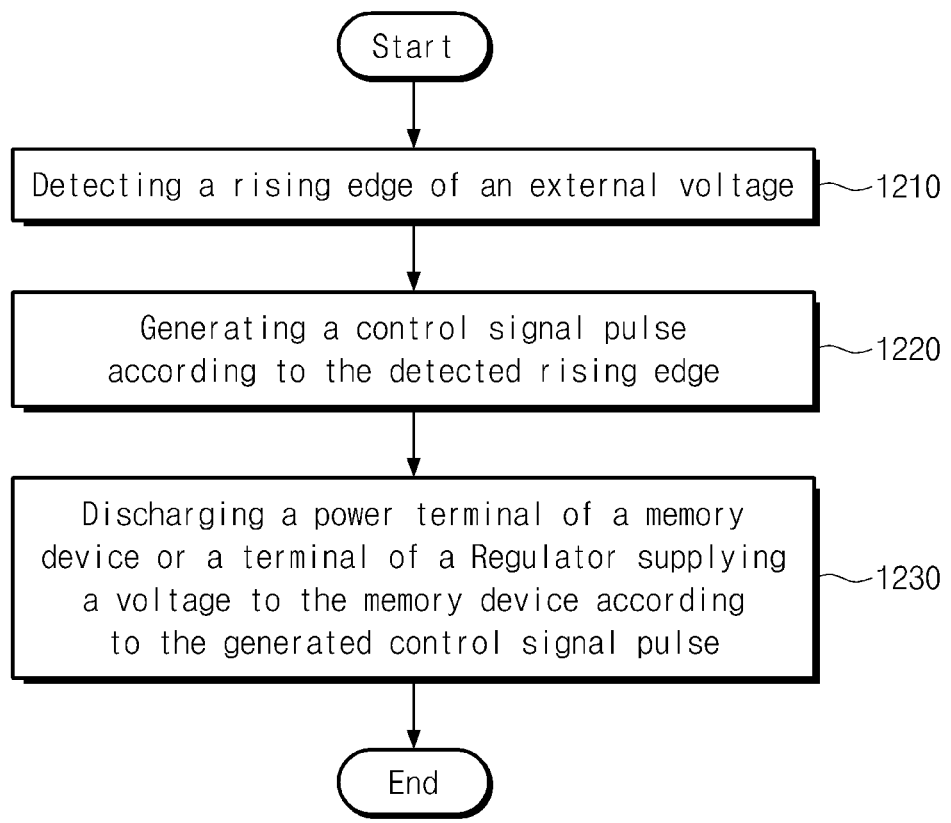
FIG. 12 is a flowchart illustrating a method of performing a power-on-reset process in a data storage device according to an embodiment of the present general inventive concept.

Referring to FIG. 12, a method of controlling POR includes detecting a rising edge of an external voltage or detecting a voltage level of an external voltage at operation 1210, generating a control signal, for example, a control signal pulse, according to the detected rising edge or voltage level at operation 1220, and discharging one or more terminals of a memory device, an enable circuit, and a voltage regulator at operation 1230.

According to a data storage device including a reset circuit and a method of resetting thereof of the inventive concept, reliability of POR of a memory device may be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A data storage device comprising:
   a memory device having a power terminal to receive a driving voltage;
   a voltage regulator to adjust an external voltage to provide the adjusted voltage to the power terminal of the memory device; and
   a reset circuit to discharge an enable terminal of the voltage regulator or the power terminal of the memory device, wherein the reset circuit comprises:
   a voltage detector to generate a control signal pulse of a predetermined duration in response to a change of the external voltage, the predetermined duration being independent of a voltage level of the external voltage; and
   a compulsory discharge circuit to discharge the enable terminal and the power terminal for the predetermined duration in response to the control signal pulse, and to stop the discharge of the enable terminal or the power terminal at an end of the predetermined duration.

2. The data storage device of claim 1, wherein the compulsory discharge circuit comprises a switching device to provide a ground to the enable terminal or the power terminal in response to the control signal pulse.

3. The data storage device of claim 2, further comprising:
   a current limiting device connected to between the switching device and the ground to limit a size of a discharge current.

4. The data storage device of claim 2, wherein the switching device comprises an N-type metal-oxide-semiconductor (NMOS) transistor.

5. The data storage device of claim 1, further comprising:
   an enable circuit to provide the external voltage to the enable terminal.

6. The data storage device of claim 5, wherein the enable circuit comprises a capacitor charged by the external voltage.

7. The data storage device of claim 1, wherein the memory device is a semiconductor memory device reset by a Power-On-Reset (POR) method.

8. The data storage device of claim 1, further comprising:
   an auxiliary power providing a charged external voltage as an auxiliary voltage.

9. The data storage device of claim 8, wherein the auxiliary power comprises a super capacitor or a backup battery.

10. The data storage device of claim 1, wherein the reset circuit discharges the enable terminal or the power terminal based on detecting a rising edge of the external voltage.

11. The data storage device of claim 10, wherein the reset circuit discharges the enable terminal or the power terminal when the external voltage becomes higher than a reference voltage at the rising edge of the external voltage.

12. The data storage device of claim 10, wherein the reset circuit detects the rising edge of the external voltage during Power-On-Reset (POR).

13. The data storage device of claim 10, wherein the voltage detector generates the control single pulse in response to the rising edge of the external voltage.

14. A method of resetting a data storage device including a memory device and a voltage regulator that provides a driving voltage of the memory device, the method comprising:
   detecting a rising edge of an external voltage;
   generating a control signal pulse of a predetermined duration in response to the rising edge;
   discharging a power terminal of the memory device during a pulse interval of the control signal pulse to disable the memory device for at least the predetermined duration, the predetermined duration being independent of a voltage level of the external voltage; and
   stopping the discharge of the power terminal of the memory device at a conclusion of the predetermined duration.

15. The method of claim 14, further comprising:
   discharging an enable terminal of the voltage regulator during the pulse interval.

16. The method of claim 15, wherein the enable terminal of the voltage regulator and the power terminal of the memory device are simultaneously discharged.

17. The method of claim 14, wherein the control signal pulse is generated at a timing of when the external voltage becomes higher than a specific level at the rising edge.

18. A solid state drive (SSD) comprising:
a nonvolatile memory device;
a voltage regulator to adjust an external voltage to provide the adjusted voltage as a driving voltage of the nonvolatile memory device;
an auxiliary power device to charge the external voltage to provide the charged external voltage as an auxiliary power; and
a reset circuit to discharge a power terminal of the memory device by detecting a rising edge of the external voltage during power-on-reset (POR) to disable the memory device for a predetermined duration, the predetermined duration being independent of a voltage level of the external voltage, and the reset circuit configured to enable the memory device at a conclusion of the predetermined duration.

19. The SSD of claim 18, wherein the reset circuit discharges an enable terminal of the voltage regulator during the POR.

20. A data storage device comprising:
a memory device;
a voltage regulator connected to the memory device to supply a power voltage to the memory device according to an external voltage; and
a reset circuit to discharge at least one of an enable terminal of the voltage regulator and the memory device by detecting a rising edge of the external voltage during a power-on-reset operation to disable the voltage regulator and the memory device for a predetermined duration, the predetermined duration being independent of a voltage level of the external voltage, and the reset circuit configured to stop the discharge of the enable terminal of the voltage regulator or the memory device at a conclusion of the predetermined duration.

21. The data storage device of claim 20, wherein:
the power voltage is higher than a reference corresponding to a resetting of the power-on-reset operation when the external voltage is in a power off state; and
the reset circuit detects the rising edge of the external voltage after the external voltage is in a power on state from the power off state and generates a signal to discharge at least one of an input terminal or an output terminal of the voltage regulator such that the power voltage is lower than the reference.

22. The data storage device of claim 20, wherein the memory device performs resetting of the power-on-reset operation according to the power voltage supplied from the voltage regulator after the reset circuit discharges at least one of the voltage regulator and the memory device during the power on state of the external voltage supplied to the voltage regulator.

23. The data storage device of claim 20, further comprising:
a power circuit to supply power as the external voltage,
wherein the power circuit comprises a main power source and an auxiliary power source having at least one of a super capacitor array and a backup battery.

24. The data storage device of claim 20, further comprising:
a controller to control the memory device,
wherein the memory device, the voltage regulator, the reset circuit, and the controller are installed in a housing to form a solid state drive.

25. The data storage device of claim 24, wherein:
the housing of the solid state drive is detachably attached to an external host such that the controller and the voltage regulator are connected to the external host; and
the voltage regulator receives the external voltage from the external host to generate the power voltage and the controller receives a control signal from the external host to control the memory device.

26. The data storage device of claim 20, further comprising:
a memory controller including the voltage regulator, the reset circuit, and a control unit to control the memory device,
wherein the memory device is combined with the memory controller to form a memory card.

27. The data storage device of claim 26, wherein:
the memory card is detachably attached to a computing unit to form a computing system; and
the computing unit of the computing system supplies the external voltage to the memory card, outputs a signal to the memory device, and receives data from the memory device.

* * * * *